US006853261B1

(12) United States Patent
Ling

(10) Patent No.: US 6,853,261 B1
(45) Date of Patent: Feb. 8, 2005

(54) METHOD AND APPARATUS FOR CALIBRATING VOLTAGE-CONTROLLED DEVICES

(75) Inventor: Curtis Chih-shan Ling, San Diego, CA (US)

(73) Assignee: RFMD WPAN, Inc., San Diego, CA (US)

( * ) Notice: Subject to any disclaimer, the term of this patent is extended or adjusted under 35 U.S.C. 154(b) by 0 days.

(21) Appl. No.: 10/141,105

(22) Filed: May 7, 2002

(51) Int. Cl.[7] ............................................. H03B 5/18
(52) U.S. Cl. ........................................ 331/100; 331/44
(58) Field of Search ..................... 331/36, 100, 36 R, 331/36 C, 44, 16, 34, 177 V, 182, 183

(56) References Cited

U.S. PATENT DOCUMENTS

| | | | |
|---|---|---|---|
| 3,890,635 A | 6/1975 | Engeler ........................ 357/14 |
| 3,909,748 A | 9/1975 | Yuan et al. .................. 331/117 |
| 5,175,884 A | * 12/1992 | Suarez ......................... 455/260 |
| 5,297,056 A | 3/1994 | Lee et al. ..................... 364/482 |
| 5,625,325 A | 4/1997 | Rotzoll et al. ............... 331/179 |
| 5,739,730 A | 4/1998 | Rotzoll ......................... 331/179 |
| 5,745,012 A | 4/1998 | Oka et al. ....................... 331/68 |
| 5,905,398 A | 5/1999 | Todsen et al. ............... 327/337 |
| 5,912,632 A | 6/1999 | Dieska et al. .................. 331/23 |
| 5,914,513 A | 6/1999 | Shenai et al. ................ 257/312 |
| 6,114,920 A | 9/2000 | Moon et al. .................. 331/179 |
| 6,175,282 B1 | 1/2001 | Yasuda .......................... 331/44 |
| 6,211,745 B1 | 4/2001 | Mucke et al. ................ 331/117 |
| 6,323,736 B2 | 11/2001 | Jansson ......................... 331/117 |

FOREIGN PATENT DOCUMENTS

WO  WO9626545  9/1996

OTHER PUBLICATIONS

R. Castello, et al., A±30% Tuning Range Varactor Compatible with Future Scaled Technologies, Symposium on VLSI Circuits, New York, U.S., IEEE, vol. Conf. 12, pp. 34–35, Nov. 6, 1998, CP002104577.

* cited by examiner

*Primary Examiner*—Timothy P. Callahan
*Assistant Examiner*—Cassandra Cox
(74) *Attorney, Agent, or Firm*—Withrow & Terranova, PLLC

(57) ABSTRACT

A method and apparatus for calibrating a voltage-controlled device in a control loop is disclosed. The method and apparatus of the present invention maintains a control voltage of a voltage-controlled device within a high tuning sensitivity range, and thus improves the performance of the voltage-controlled device. The present inventive method and apparatus features a voltage windowing method wherein a high tuning sensitivity window is a subset of the low tuning sensitivity window. In one embodiment, the present invention maintains a control voltage within a predetermined tuning sensitivity window or range. In another embodiment, the present inventive method and apparatus calibrates a PLL that includes multiple VCOs. In yet another embodiment, the present invention calibrates control voltages to account for changes in operating temperature.

31 Claims, 9 Drawing Sheets

METHOD AND APPARATUS FOR CALIBRATING VOLTAGE-CONTROLLED DEVICES

CROSS-REFERENCE TO RELATED PATENTS

This application is related to commonly assigned U.S. Pat. No. 6,211,745, issued Apr. 3, 2001, entitled, "Method and Apparatus for Digitally Controlling the Capacitance of an Integrated Circuit Device using MOS-Field Effect Transistors", and U.S. Pat. No. 6,323,736, issued Nov. 27, 2001, entitled "Method and Apparatus for Calibrating a Frequency Adjustable Oscillator in an Integrated Circuit Device", both hereby incorporated by reference in their entirety for their teachings on voltage-controlled devices.

BACKGROUND OF THE INVENTION

1. Field of the Invention

This invention relates to integrated circuit devices, and more particularly to a method and apparatus for calibrating voltage-controlled devices in control loop circuits.

2. Description of Related Art

Voltage-controlled devices used as basic building blocks in a variety of practical applications. For example, transmitters typically include voltage-controlled oscillators (VCO) that operate over a wide frequency range. These VCOs include voltage-controlled circuit elements such as variable capacitors (i.e., varactors) that have wide tuning ranges.

Disadvantageously, voltage-controlled circuit elements having wide tuning ranges are extremely sensitive to small changes in the control voltage (i.e., small changes in the control voltage result in large changes in output frequency), which is undesirable in practical circuit applications such as VCOs.

One method of implementing a VCO that attempts to overcome the above described sensitivity problem uses digitally controlled "coarse tune" circuit elements (e.g. switched capacitors) in addition to "fine tune" circuit elements (e.g. a varactor having a narrow tuning range) to provide operation over a wide range of frequencies. One such method is described in the above-incorporated U.S. Pat. No. 6,323,736 (hereinafter referred to as the '736 patent). One of the VCO implementations described in the '736 patent is shown in FIG. 8. As shown, FIG. 8 includes a plurality of digitally controlled capacitors 802 and a pair of varactors 806 and 806' arranged in a parallel configuration. The varactors provide fine tune capabilities (i.e., small changes in output frequency) in response to a control voltage $V_{TUNE}$ 810; the plurality of digitally controlled capacitors provides coarse tune capabilities (i.e. large changes in output frequency for a given control voltage change). The plurality of digitally controlled capacitors, which may be controlled by digital control voltages Vc1, Vc2, Vc3 and Vc4, effectively increases the tuning range of the VCO. The '736 patent also describes a VCO as used in a phase lock loop (PLL) implementation.

One drawback of the coarse/fine tuning method is that the varactors used to implement the method are non-linear by nature, and thus tuning sensitivity (i.e., the ability to change capacitance or capacitance-related characteristics in accordance with a control voltage) varies greatly depending upon the control voltage. Thus, an application that implements the coarse/fine tune method may attempt to operate in a low sensitivity tuning range, which can limit its overall operating frequency range. Absolute varactor capacitance values depend on manufacturing process variations. Calibration is essentially a closed-loop procedure for allowing circuits to adapt to these variations.

Another drawback associated with the coarse/fine tune method is the lack of a means for calibrating control voltage drift due to temperature variations. As is well known, performance characteristics of circuits and devices can vary depending on temperature. For example, circuit temperature can increase during circuit operation from morning to afternoon; and temperature-dependent circuit characteristics can cause the control voltage to drift into tuning regions having low sensitivity. Thus, the frequency range of the PLL may be limited by the temperature variations. Accordingly, the effective operating temperature range of the circuit is limited without calibration.

Therefore, a need exists for a method and apparatus that overcomes these above-identified drawbacks. The need exists for an apparatus such as a voltage-controlled device in a control loop that maintains high tuning sensitivity. In addition, the need exists for an apparatus and method that can dynamically calibrate a voltage-controlled device such as a VCO for temperature changes. The present invention provides such a method and apparatus.

SUMMARY OF THE INVENTION

The present invention is a novel method and apparatus for calibrating a voltage-controlled device in a control loop, wherein a control voltage of a voltage-controlled device is maintained within a high tuning sensitivity range. The present inventive method and apparatus features a voltage windowing method wherein a high tuning sensitivity window is a subset of a low tuning sensitivity window. The present invention is particularly useful in PLL circuits that include voltage-controlled oscillators.

In a first exemplary embodiment, the present invention maintains a control voltage within a predetermined tuning sensitivity window or tuning sensitivity range, and thus the output frequency can be rapidly and accurately controlled. In a second exemplary embodiment, the present inventive method and apparatus calibrates a PLL that includes multiple VCOs. In a third exemplary embodiment, the present invention calibrates control voltages to compensate for changes in temperature.

The details of the embodiments of the present invention are set forth in the accompanying drawings and the description below. Once the details of the invention are known, numerous additional innovations and variations will become obvious to those skilled in the electronic circuit design arts.

DETAILED DESCRIPTION OF THE INVENTION

Throughout this description, the preferred embodiment and examples shown should be considered as exemplars, rather than as limitations on the present invention.

The present invention is a method and apparatus for calibrating a voltage-controlled device in a control loop. The present invention maintains a control voltage of a voltage-controlled device within a high tuning sensitivity range, and thus improves circuit performance. The present inventive method and apparatus features a voltage "windowing" or ranging method wherein a high tuning sensitivity window (i.e., range) is a subset of a low tuning sensitivity window.

Several exemplary embodiments of the present invention are described. In a first exemplary embodiment, the present invention maintains a control voltage within a predetermined tuning sensitivity window or tuning sensitivity range. In a second exemplary embodiment, the present inventive method and apparatus calibrates a PLL that includes multiple VCOs. In a third exemplary embodiment, the present invention calibrates control voltages to account for temperature variations.

In one embodiment, the present invention is used to calibrate a voltage-controlled device in a control loop. An exemplary circuit comprising a voltage-controlled oscillator in a phase lock loop is described, however, the present invention can be used in other voltage-controlled devices and control loops without departing from its scope or spirit. An exemplary circuit adapted for use with the present invention is now described with reference to FIG. 1.

Exemplary PLL Circuit Adapted for Use with the Present Calibration Method and Apparatus The present inventive method and apparatus may be used in phase lock loop (PLL) circuits that include VCOs. However, the circuit descriptions provided herein are not meant to limit the present invention as the inventive method and apparatus can be used in any control loop that includes a voltage-controlled device. An exemplary PLL circuit is described herein and in the above-incorporated U.S. Pat. No. 6,323,736 ('736 patent).

Figure 1:
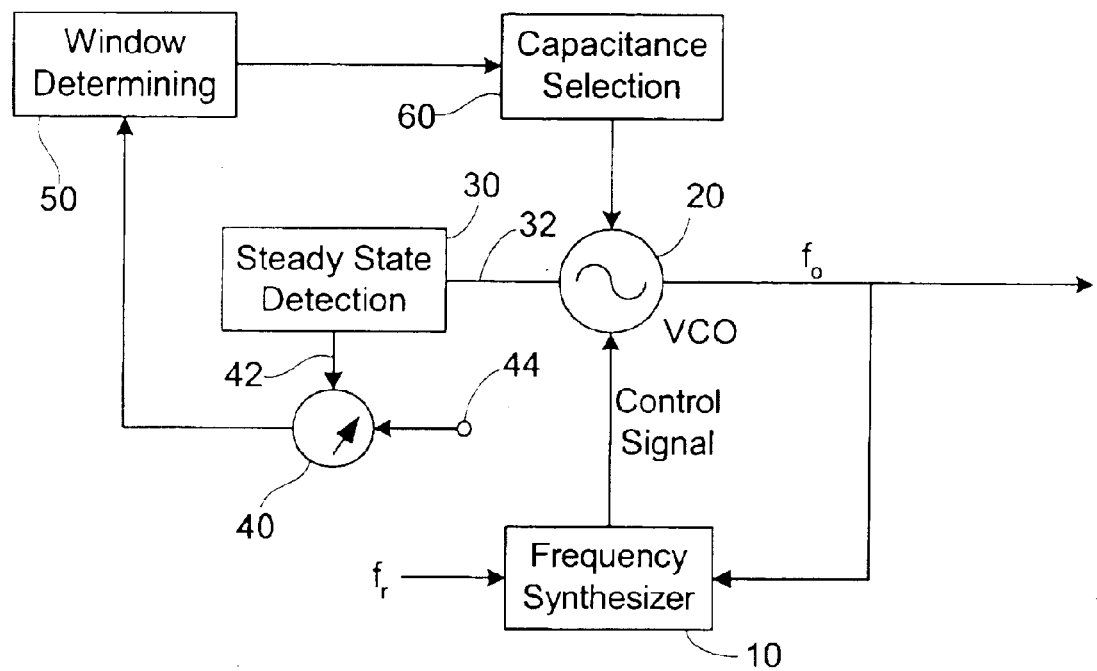
FIG. 1 is a simplified block diagram of an exemplary PLL circuit adapted for use with the present calibration method and apparatus.

FIG. 1 is a block diagram of an exemplary PLL circuit adapted for use with the present calibration method and apparatus. The exemplary PLL circuit 100 functions in a well-known manner to generate an output frequency $f_o$ that is locked in phase with a precision reference signal $f_r$. As shown in FIG. 1, the exemplary PLL circuit 100 includes a frequency synthesizer 10 and a voltage-controlled oscillator (VCO) 20. The VCO 20 outputs an output signal having output frequency $f_o$. The frequency synthesizer 10 receives a precision reference signal $f_r$ and the output frequency $f_o$ and inputs a control signal to the voltage-controlled device 20. In one embodiment, the frequency synthesizer 10 inputs a control voltage $V_{ctl}$ to the VCO 20.

Figure 8:
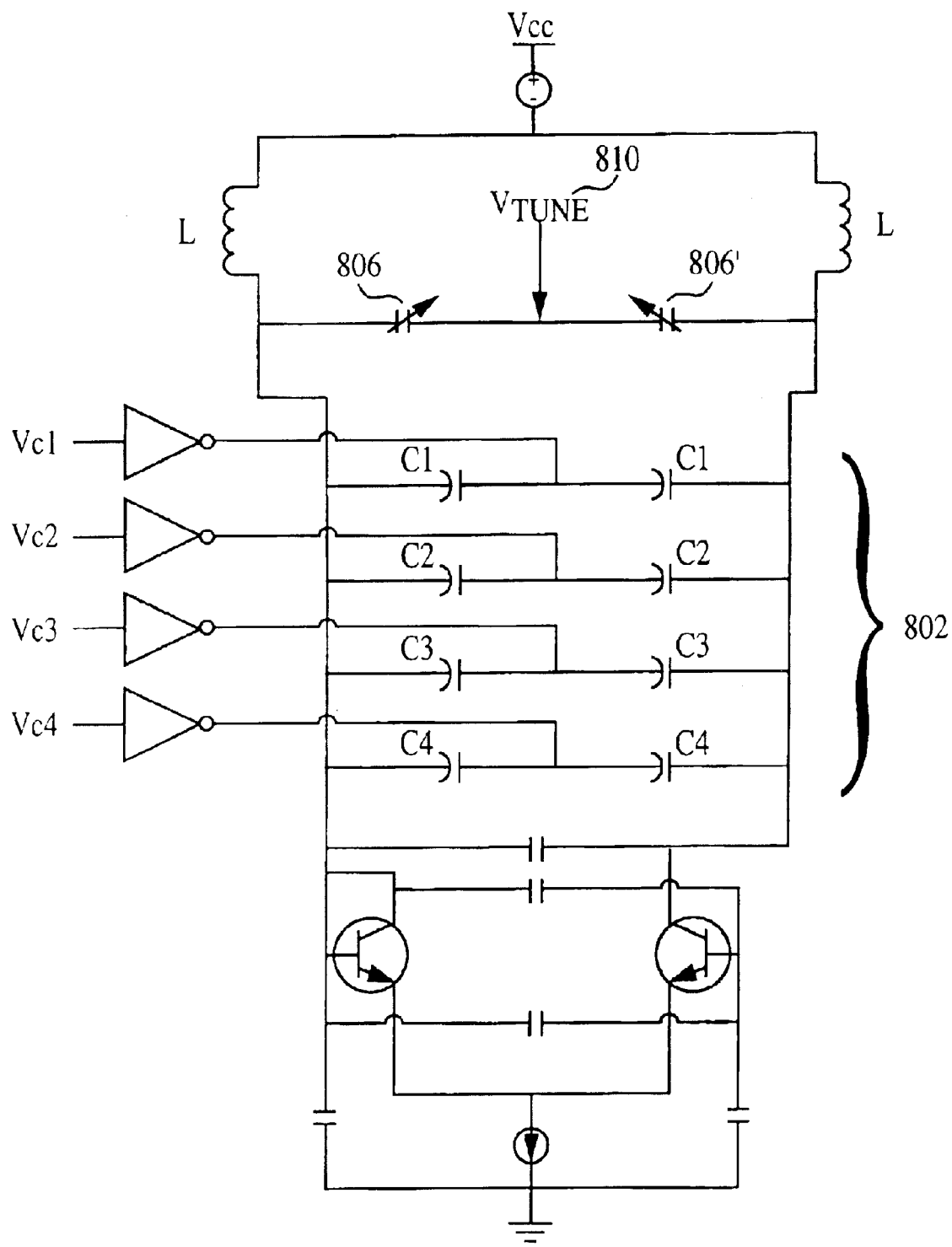
FIG. 8 shows one implementation of a voltage controlled oscillator.
Figure 9:
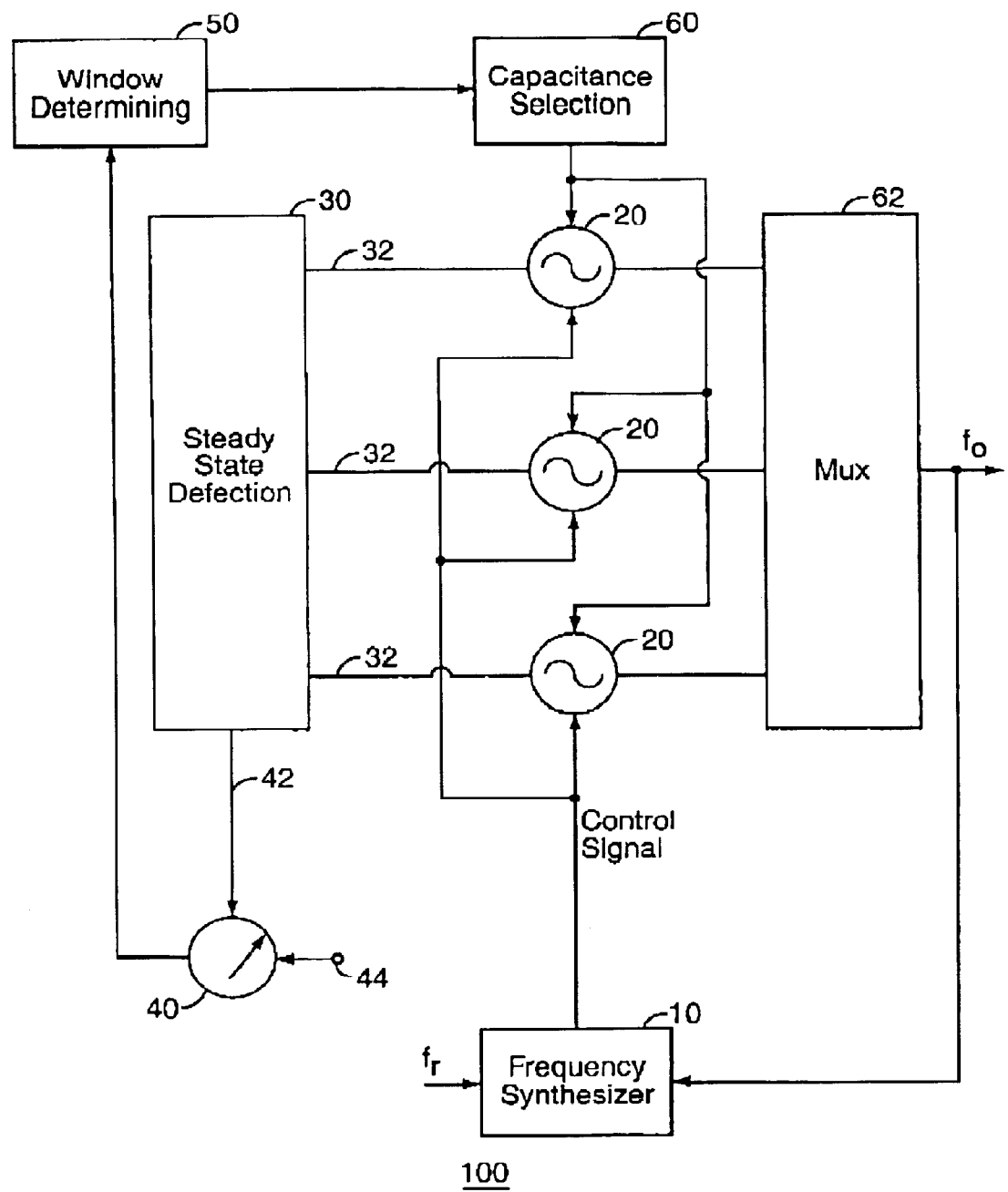
FIG. 9 shows simplified block diagram of an exemplary PLL circuit including a plurality of voltage controlled oscillators and adapted for use with the present calibration method and apparatus Like reference numbers and designations in the various drawings indicate like elements.

In the exemplary PLL circuit, the VCO 20 may include a digital capacitor and a varactor. Exemplary VCOs, digital capacitors and varactors that can be utilized in the exemplary PLL circuit are described in more detail in the incorporated '736 patent, and thus are not described in great detail herein. Specifically, the incorporated '736 patent describes the following components: an exemplary digital capacitor (FIGS. 4–5 of the '736 patent), a first exemplary VCO circuit that includes a digital capacitor (FIG. 8 of the '736 patent) and a second exemplary VCO circuit that includes a digital capacitor (FIGS. 9–10 of the '736 patent).

FIG. 1 further shows a steady state detection device 30 that is connected to the VCO 20 by a connection 32. A control voltage measurement device 40 is responsive to the control loop steady state detection device 30, to which it is connected as indicated by a connection 42. When the control loop steady state detection device 30 determines that the control loop has reached steady state, the control voltage measurement device 40 measures and provides information about such loop control voltage to a window determining device 50. Results of the window determining device 50 are provided to a capacitance selection device 60. The capacitance selection device 60 is configured to select a steady-state capacitance level for a multiple capacitance-level capacitor within the VCO 20. In particular, the capacitance selection device 60 selects a capacitance that corresponds to the control voltage being within a window.

As is well know in the electronics arts, varactors comprise capacitors that vary their capacitance depending upon an applied voltage (i.e., control voltage). Varactors are non-linear devices (i.e., capacitance varies non-linearly with control voltage variations). Thus tuning sensitivity will vary depending on the input control voltage. For example, increased tuning sensitivity occurs during a first range of control voltages and low tuning sensitivity occurs during a second range of control voltages.

Figure 2A:
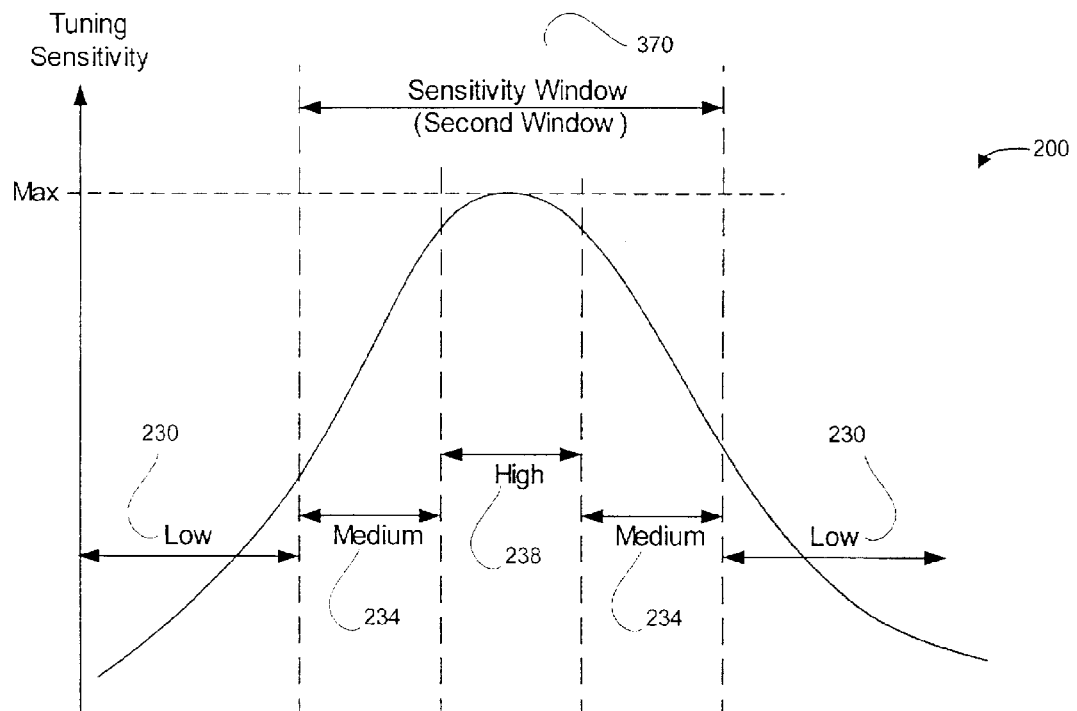
FIG. 2a shows the tuning sensitivity of a VCO as a function of the VCO tuning voltage.
Figure 2B:
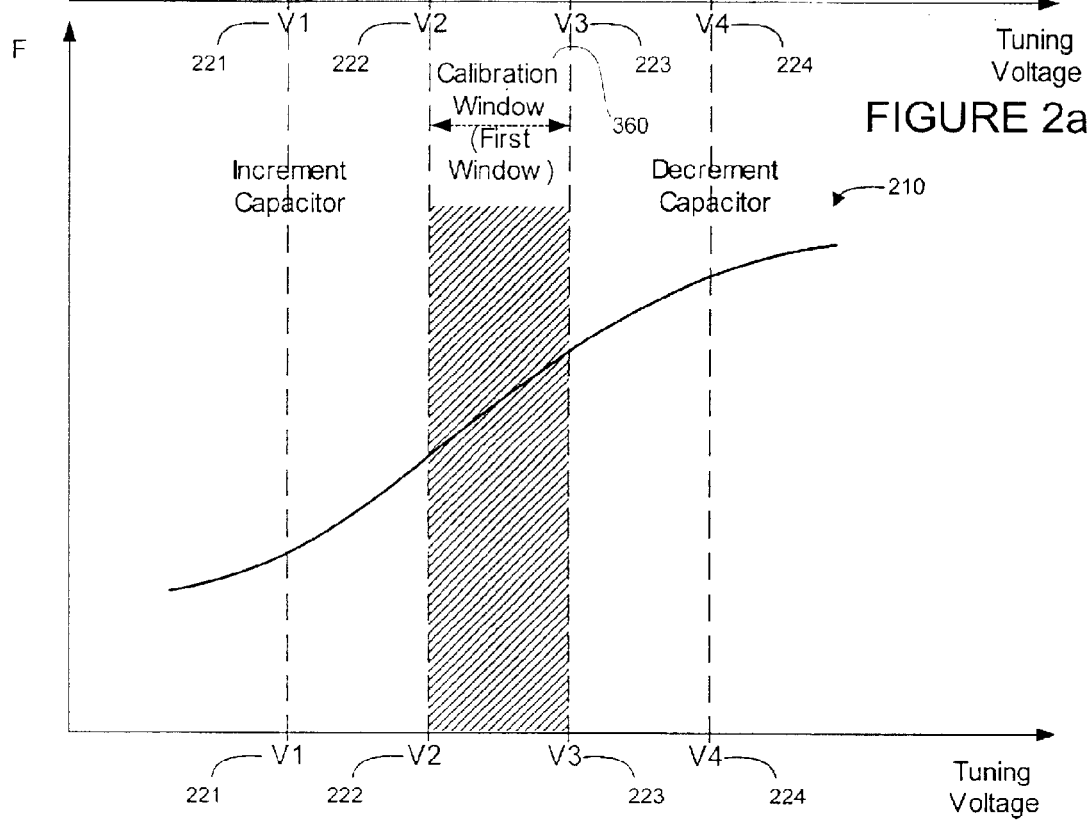
FIG. 2b shows the VCO output frequency plotted as a function of the VCO tuning voltage.

The VCO 20 of the exemplary PLL circuit 100 may include a varactor, and thus tuning sensitivity of the VCO 20 will be non-linear under these circumstances. FIG. 2a shows a graph depicting VCO tuning sensitivity as a function of VCO tuning voltage. FIG. 2b shows the VCO output frequency as a function of the VCO tuning voltage. As shown in FIG. 2a, the tuning sensitivity graph 200 is separated into three arbitrarily selected sensitivity ranges: "low" sensitivity ranges 230, "medium" sensitivity ranges 234, and a "high" sensitivity range 238. The low sensitivity ranges 230 comprise tuning voltages that are less than a low threshold V1 221 and greater than a highest threshold V4 224. The medium sensitivity ranges comprise tuning voltages ranging between the low threshold V1 221 and a second higher threshold V2 222, and between a third threshold V3 223 and the highest threshold V4 224. The high sensitivity range comprises tuning voltages ranging between the second higher threshold V2 222 and the third threshold V3 223.

Referring now to FIG. 2b, the output frequency graph 210 corresponds to the tuning sensitivity graph 200 of FIG. 2a, wherein tuning sensitivity (FIG. 2a) corresponds to the derivative of the VCO output frequency shown in FIG. 2b (i.e., output frequency rates of change correspond to the tuning sensitivity). For example, as shown in FIG. 2b, higher output frequency rates of change correspond to the high sensitivity range 238 (i.e., tuning voltages ranging between the thresholds V2 222 and V3 223). Similarly, low and medium output frequency rates of change correspond to the low and medium sensitivity ranges 230, 234, respectively.

In an exemplary embodiment of the VCO 20, the high sensitivity range 238 comprises tuning voltages corresponding to tuning sensitivities greater than 80 percent of the maximum tuning sensitivity. The medium sensitivity range 234 comprises tuning voltages corresponding to tuning sensitivities between 50 and 80 percent of the maximum tuning sensitivity. The low sensitivity range 230 comprises tuning voltages corresponding to tuning sensitivities less than 50 percent of the maximum tuning sensitivity. As is well known in the VCO design arts, it is desirable to design voltage-controlled oscillators (e.g., the VCO 20) such that they operate within the high sensitivity range 238. Output frequency can be rapidly adjusted within this range of tuning voltages. Those skilled in the VCO design arts shall recognize that these percentages of the sensitivity ranges are exemplary only and different percentages can be used to practice the present invention without departing from its spirit or scope.

The digital capacitor and varactor of the VCO 20 of FIG. 1 may be configured in a parallel arrangement and operate in a well-known manner to vary capacitance. The digital capacitor increases and decreases capacitance depending upon a coarse control signal (e.g., a control word). Further, the varactor may also increase and decrease capacitance depending upon a fine control signal (e.g., a tuning voltage). For example, as described in greater detail in the '736 patent, a digital capacitor controls coarse capacitance, while the varactor controls fine capacitance.

The present inventive method and apparatus uses varying sensitivity ranges (e.g., the medium and high sensitivity ranges 234, 238) of the exemplary VCO to maintain circuit operation within a desired sensitivity range (e.g., with the high sensitivity range 238 for FIGS. 2a and 2b). Specifically, the present invention features a tuning voltage "windowing" or ranging method wherein a high tuning sensitivity window (i.e., sensitivity range) comprise a subset of a low tuning sensitivity window. The tuning voltage windowing method of the present invention is described below with reference to FIGS. 3–8.

Tuning Voltage Windowing Method

The inventor has observed that VCOs that include digital capacitors and varactors can be designed to maintain circuit operation within a high sensitivity range, and thus output frequency can be rapidly and accurately controlled. The inventive tuning voltage windowing method (hereinafter referred to as the inventive "windowing method") maintains circuit operation within a predetermined tuning control voltage range (e.g., between the thresholds V2 222 and V3 223) or sensitivity range (e.g., the high sensitivity range 238) by setting capacitance levels of the digital capacitor according to control voltages.

Figure 3:
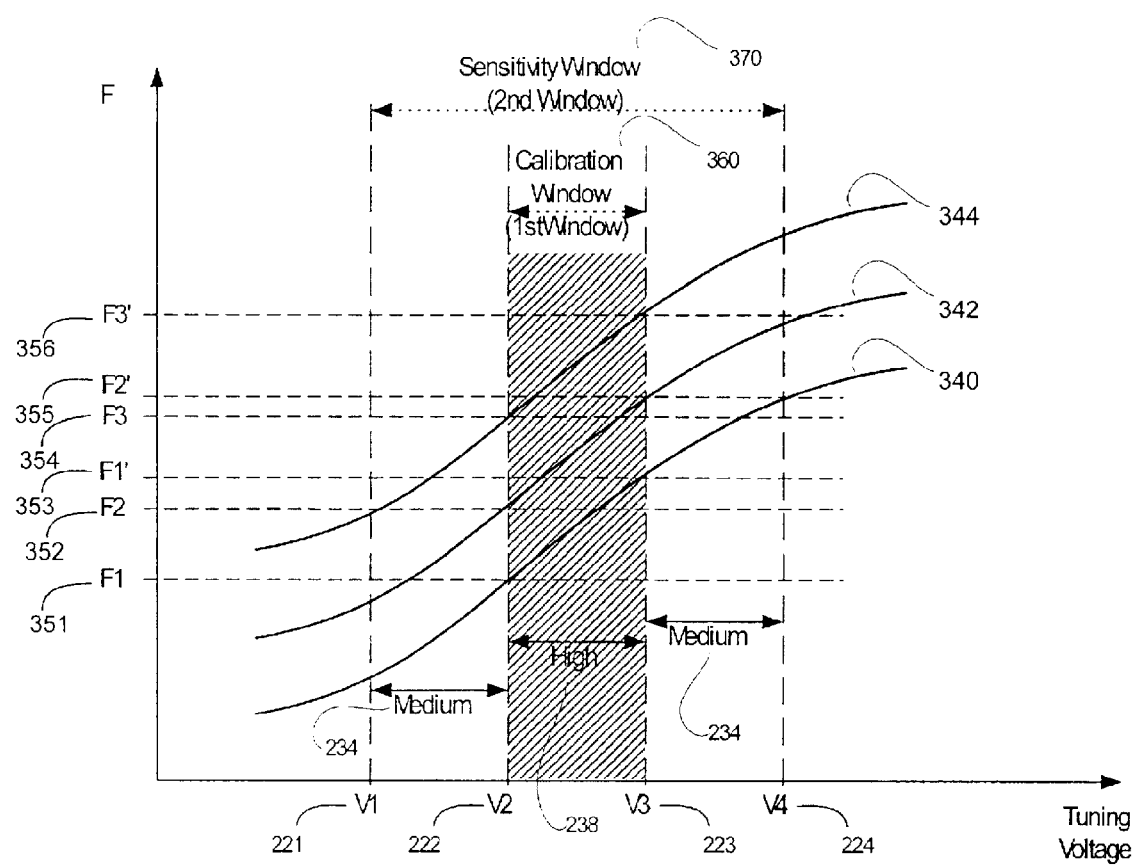
FIG. 3 is a graph depicting VCO output frequency versus tuning voltage for an exemplary VCO.

FIG. 3 is a graph depicting output frequency versus tuning voltage for an exemplary VCO. In one embodiment, the digital capacitor of the exemplary VCO has three capacitance settings: a first capacitance setting C1, a second capacitance setting C2 and a third capacitance setting C3, where C1=4*C3 and C2=2*C3. The first, second and third capacitance settings correspond to first, second and third frequency responses 340, 342, 344, respectively. As shown in FIG. 3, the first, second and third frequency responses 340, 342, 344 have a high sensitivity range 238 between the tuning voltage thresholds V2 222 and V3 223. The high sensitivity range 238 for each frequency response corresponds to different output frequencies. Specifically, the high sensitivity range for the first capacitance setting 340 corresponds to the output frequencies between F1 351 and F1' 353. The high sensitivity range for the second capacitance corresponds to the frequency outputs between F2 352 and F2' 355. Similarly, the high sensitivity range for the third capacitance corresponds to the frequency outputs between F3 354 and F3' 356. Thus, the exemplary VCO can operate at a high sensitivity range for any frequency between F1 and F3' by using different capacitance settings of the digital capacitor.

Those skilled in the VCO design arts shall recognize that the utilization of three capacitance settings is exemplary only and different capacitance settings can be used with the present invention without departing from its spirit or scope. For example nine capacitance settings can be used with the present invention to maintain the output frequency within the high sensitivity range over a large output frequency range.

As illustrated in FIG. 9, multiple VCOs 20 can be used with the present invention to maintain the output frequency within the high sensitivity range 238 over a very large frequency range without departing from the scope or spirit of the present invention. For example, the output frequency of three VCOs 20 can be multiplexed by a multiplexer (MUX) 62 in a control loop circuit, wherein a first of the VCOs 20 operates within a low frequency range, a second of the VCOs 20 operates within a medium frequency range and a third of the VCOs 20 operates within a high frequency range. In one embodiment, the frequency ranges overlap slightly. In another embodiment, the frequency ranges are adjacent to one another.

The windowing method of the present invention uses a first and second window to maintain the output frequency operation within the second window, wherein the second window is a superset of the first window. In one embodiment described below with reference to FIG. 4, the second window comprises the sensitivity window 370 (FIG. 3) and the first window comprises the calibration window 360 (FIG. 3). As shown in FIG. 3, the sensitivity window is a superset of the calibration window.

Figure 4:
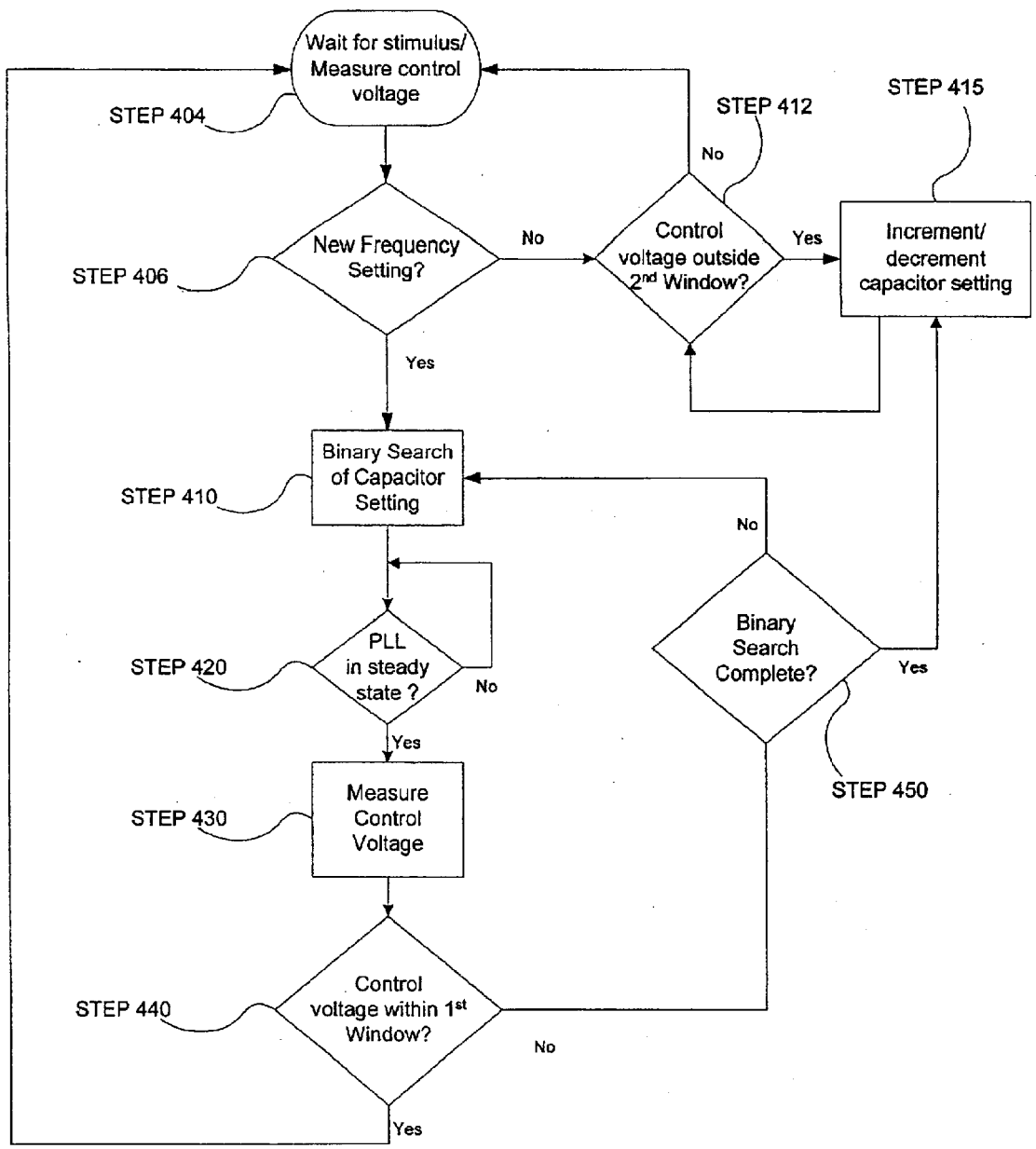
FIG. 4 is a flowchart of an exemplary embodiment of the inventive windowing method adapted for use with the exemplary PLL circuit of FIG. 1.

FIG. 4 is a flowchart of an exemplary embodiment 400 of the inventive windowing method used with the exemplary PLL circuit of FIG. 1. As shown in FIG. 4, the method 400 begins at a STEP 404 whereat the method waits for a stimulus, for example, a channel change. When a stimulus occurs, the method measures control voltage. After the STEP 404, the method proceeds to a decision STEP 406 whereat the method determines whether there is a new frequency setting. If there is a new frequency setting, the method proceeds to a STEP 410, else, the method proceeds to a decision STEP 412.

At the decision STEP 412, the method determines whether the control voltage is outside a second Window (e.g., sensitivity window 370 of FIG. 2). If the control voltage is outside the $2^{nd}$ Window, the method proceeds to a STEP 415, else, the method returns to the decision STEP 404.

At the STEP 415, the method increments or decrements the capacitor value depending on whether the control voltage is above or below the 2nd Window. The method continues to increment or decrement the capacitor value if the control voltage remains outside of 2nd Window. In one embodiment, the method increments the capacitance setting if the control voltage is below the 2nd Window until the circuit operates within a 1st Window (e.g., calibration window 360). In this embodiment, the method also decrements the digital capacitor setting if the control voltage is above the 2nd Window until the circuit operates within the 1st Window. After the STEP 415, the method returns to the decision STEP 412.

At the STEP 410, the method performs a binary search of the capacitor setting (i.e., a capacitance setting or control word for a binary capacitor). The method performs the binary search of digital capacitor setting in any well-known manner to determine whether the control voltage is within the 1$^{st}$ Window as determined by the digital capacitor setting.

After the STEP 410, the method proceeds to a decision STEP 420 whereat the method determines whether the PLL circuit is in steady state (i.e., the PLL is locked). In one embodiment, the output frequency is measured and determined to be within a predetermined range. Those skilled in the PLL art shall recognize that alternative methods of determining whether a PLL is in steady state can be used. For example, steady state detection determination can be accomplished using other circuit characteristics such as control voltage. If the PLL circuit is determined to not be in steady state, the method returns to the decision STEP 420 (i.e., the method waits until the PLL circuit is in steady state).

If the PLL is determined to be locked or in steady state at the STEP 420, the method proceeds to a STEP 430 whereat control voltage is measured. After the STEP 430, the method proceeds to a decision STEP 440 whereat the method determines whether the control voltage is within the 1$^{st}$ Window. If so, the method returns to the STEP 404, else, the method proceeds to a decision STEP 450 whereat the method determines whether the binary search is complete. If so, the method proceeds to the STEP 415, else, the method returns to the STEP 410.

Those skilled in the VCO design arts shall recognize that the use of two windows in the present inventive tuning voltage windowing method is exemplary only and different numbers of windows can be used with the present invention without departing from its spirit or scope. For example, three windows can be used with the present invention to maintain the output frequency within the high sensitivity range over a large output frequency range.

Figure 5:
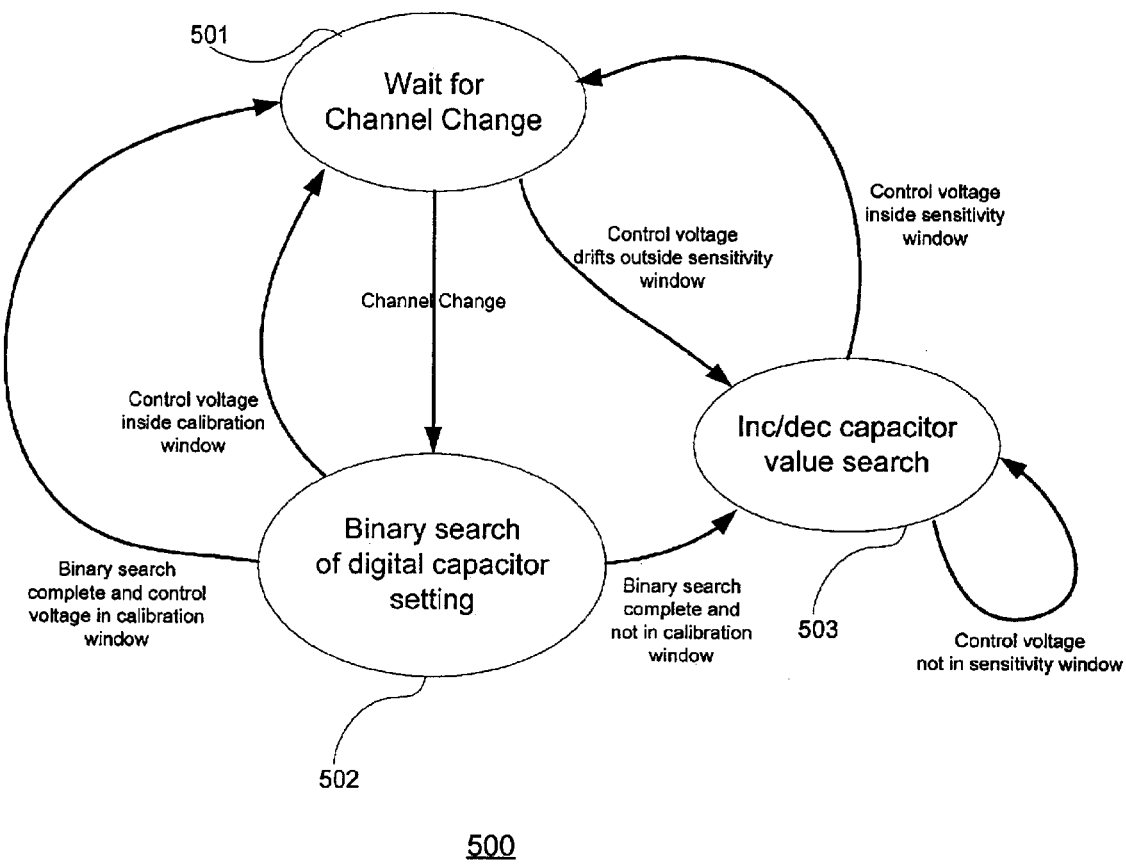
FIG. 5 is a state diagram of the present inventive windowing method utilized with the exemplary PLL circuit of FIG. 1.

FIG. 5 is a state diagram of the present inventive windowing method utilized with the exemplary PLL circuit of FIG. 1. As shown in FIG. 5, in one embodiment, the state diagram comprises 3 states: wait for channel change 501, binary search of digital capacitor setting 502 and increment/decrement capacitor value search 503. The exemplary windowing method performs two types of searches: a binary search 502 and an increment/decrement capacitor search 503. Upon channel initialization, the method executes the binary search of digital capacitor setting 502 in any well-known manner to determine whether the control voltage is within the calibration window 360 and/or the sensitivity window 370 (FIG. 2) as determined by the digital capacitor setting. The method proceeds to the increment/decrement capacitor value search state 503 if the binary search is complete and the control voltage is not within the sensitivity window 370. The method proceeds to the wait for channel change state 501 if the control voltage is within the calibration window 360 or the binary search is completed and the control voltage is within the sensitivity window 370.

At the wait for channel change state 501, the method proceeds to the binary search state 502 if a channel change occurs. Otherwise, the method proceeds to the increment/decrement capacitor value search state 503 if the control voltage drifts outside of the sensitivity window 370 (e.g., due to temperature-induced changes in capacitance or other circuit/device parameters) before a channel change occurs.

At the increment/decrement capacitor value search state 503, the method increments or decrements the capacitor value depending on whether the control voltage is above or below the sensitivity window 370. The method continues to increment or decrement the capacitor value if the control voltage remains outside of the sensitivity window 370. The method proceeds to the wait for channel change state 501 if the control voltage is within the sensitivity window 370.

When multiple VCOs are used to practice the invention, an inventive initialization and windowing method can be used to prevent processing delays associated with the windowing method. These delays are due to the PLL circuit initially setting the control voltage at a boundary where adjacent VCOs operationally overlap (i.e., where both VCOs are operational), and thus the method switches between VCOs multiple times before achieving steady state.

The inventive initialization and windowing method creates a "dead zone" during initialization when the PLL circuit initially chooses the output frequency. A dead zone is an arbitrary range of output frequencies that the circuit cannot initially select. For example, the dead zone can comprise a range of output frequencies equivalent to one capacitance setting (i.e., the least significant bit of the control word of the digital capacitor of the circuit shown in FIG. 1).

Figure 6:
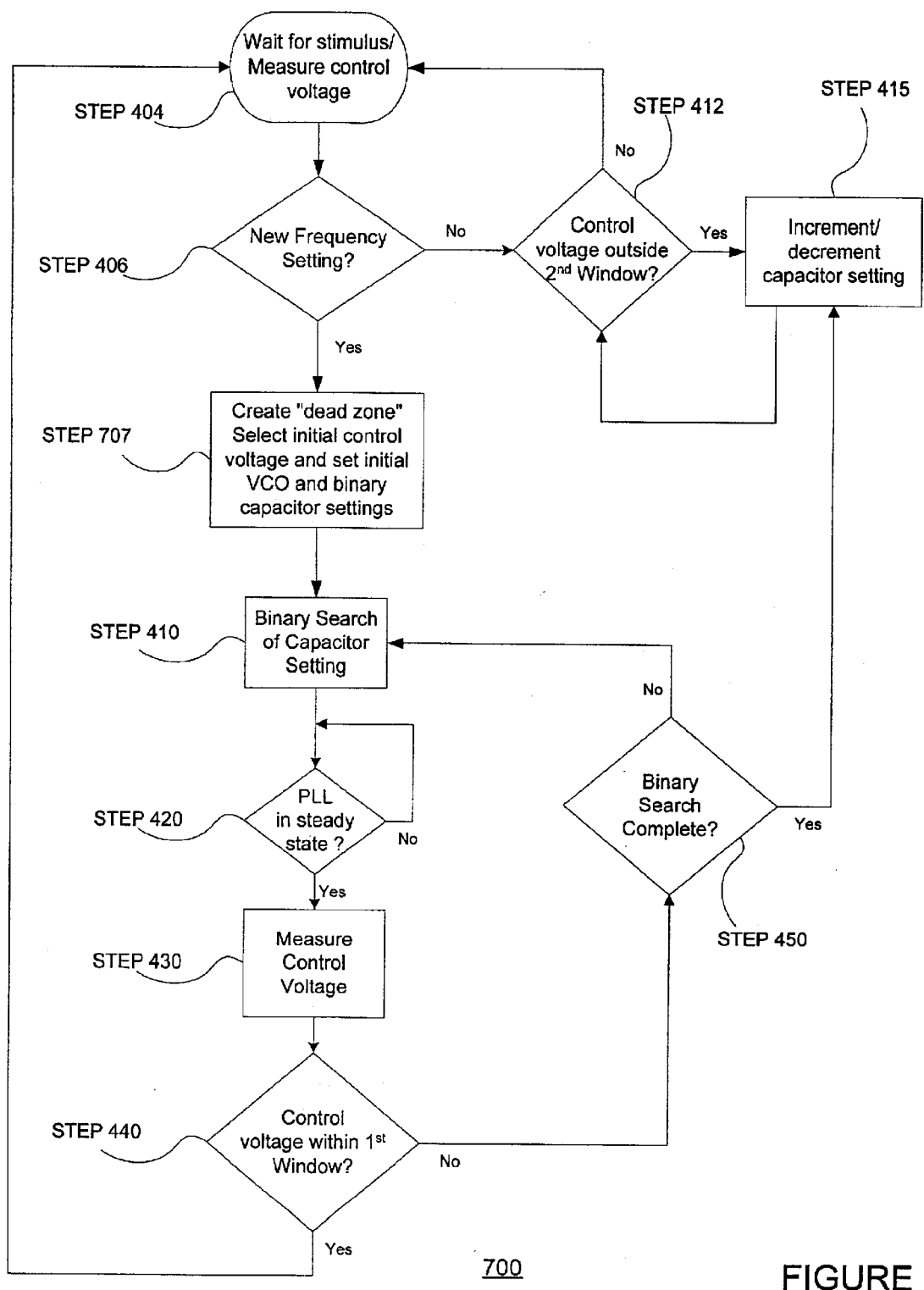
FIG. 6 is a flowchart of the present inventive initialization and windowing method.

FIG. 6 is a flowchart of the present inventive initialization and windowing method. The acts shown in the flowchart of FIG. 6 are substantially similar to those of FIG. 4, and thus identical acts are not described again in great detail. As shown in FIG. 6, the initialization method begins at a decision STEP 404 whereat the method waits for a stimulus. When a stimulus occurs, the method measures control voltage. After the STEP 404, the method proceeds to a decision STEP 406 whereat the method determines whether there is a new frequency setting. If there is a new frequency setting, the method proceeds to a STEP 707, else, the method proceeds to the decision STEP 412.

At the STEP 707, the method creates a dead zone wherein a range of capacitance settings at the boundary between the operating frequencies of the VCOs are not allowed to be selected. The method selects an output frequency outside of the dead zone and sets initial VCO and binary capacitor settings in accordance with the selected output frequency. After the STEP 707, the method proceeds to the STEP 410.

Temperature Compensation Method

The temperature compensation method of the present invention compensates for temperature-induced control voltage drift (i.e., control voltage drift caused by temperature variations). The present inventive temperature compensation method is intended for use with the inventive windowing method. However, the description of the temperature compensation method provided herein is not meant as a limitation to the present invention. Rather, the invention can be used in any circuit or system that attempts to maintain circuit operation within a predetermined operating frequency range or window.

Figure 7:
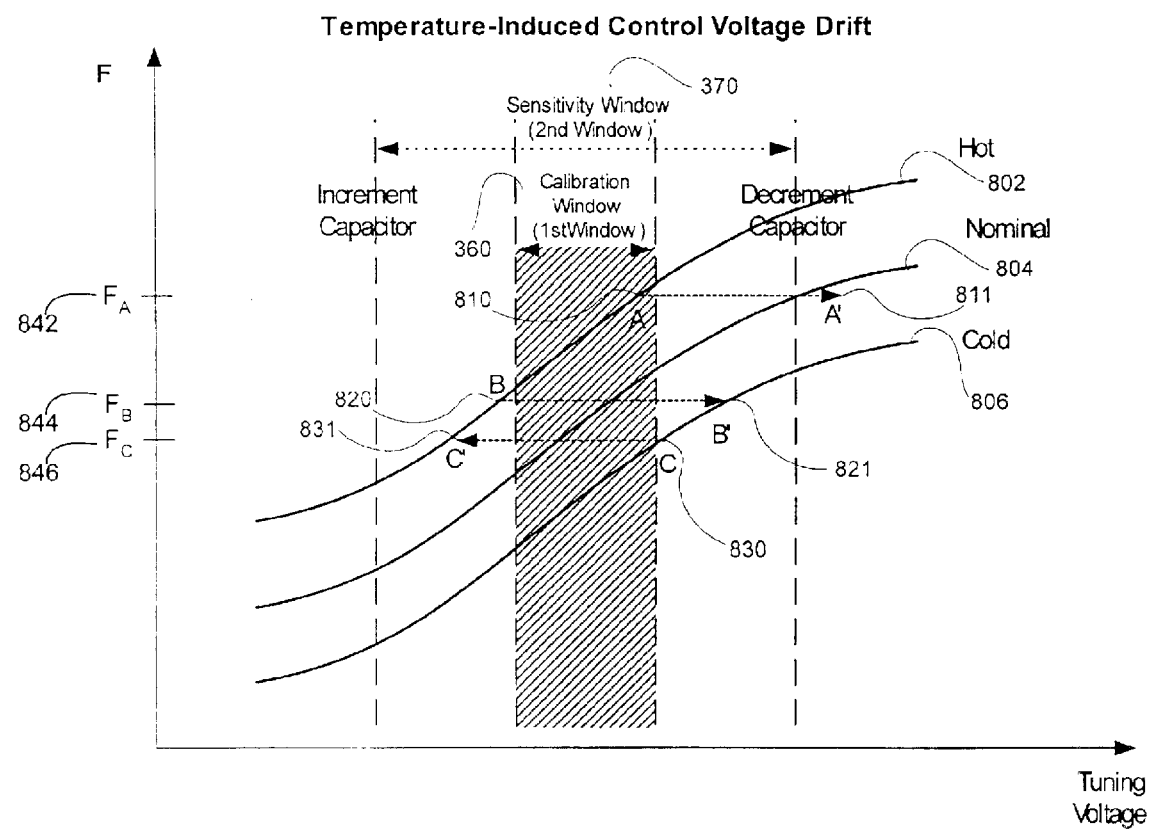
FIG. 7 shows a graph depicting VCO output frequency versus tuning voltage for VCO operation at three different operating temperatures.

FIG. 7 shows a graph of VCO output frequency versus tuning voltage for VCO operation at three different operating temperatures: hot, nominal and cold. As shown in FIG. 7, for a given control voltage, the high temperature output frequency 802 operates at higher frequencies than does the nominal temperature output frequency 804. The low temperature output frequency 806 operates at lower frequencies for a given control voltage than does the nominal temperature output frequency 804.

In accordance with the present windowing method, temperature-induced control voltage drift can cause the control voltage of the PLL circuit to drift into regions of low tuning sensitivity. A PLL circuit operating at an output frequency FA 842 under hot conditions has a tuning curve in accordance with the "hot" temperature output frequency 802. As shown in FIG. 8, at an initial time, the circuit operates within both the sensitivity and calibration windows (370 and 360, respectively) at a point A 810. At a subsequent time, the temperature decreases to a nominal temperature. Thus, the circuit operates at point A' 811, which is outside of the sensitivity window 370 and within a region of low tuning sensitivity. As is well known, operation of the PLL within a region of low tuning sensitivity can cause the PLL to exhibit locking problems. In addition, problems associated with phase noise can result.

Advantageously, the present inventive temperature compensation method compensates for temperature-induced control voltage drift by biasing or shifting the calibration window 360 so that calibration during hot temperature conditions is initiated at a point B 820 within the sensitivity window 370. The method also performs calibration during cold temperature conditions by beginning at a point C 830 that is also within the sensitivity window 370. As the temperature drift approaches nominal temperature, the circuit operation shifts from the point B 820 to the point B' 821 and from the point C 830 to the point C' 831, which are all within the sensitivity window 370. An exemplary embodiment performs temperature shift compensations at discrete temperature thresholds. The amount of temperature shift is based on a priori knowledge of temperature characteristics of the exemplary embodiment and its devices.

In one embodiment, the temperature compensation method uses a set of comparators to detect the circuit temperature. The method implements the calibration window biasing method by comparing voltage levels from two resistor strings, wherein one string is driven by a standard current source whose output voltage is proportional to temperature, and the other string is driven by a bandgap. Those skilled in the VCO design arts shall recognize that other means of detecting circuit temperature can be used without departing from the scope or spirit of the present invention. In the exemplary embodiment, the method performs temperature compensation by measuring on-chip temperature using a temperature-sensitive circuit, determining the operating temperature range of the circuit and setting the calibration window accordingly. The calibration window is set by a comparator and resistor strings, which can be shifted by shorting out or connecting additional resistors in and out of the resistor string.

Those skilled in the integrated circuit art shall recognize that shifting the calibration window 360 to the points B and C 820, 830 (as described above) are exemplary only and that the inventive temperature compensation method can begin calibration at different points depending on temperature. The present inventive temperature compensation method improves the range of tolerable temperature-induced drift in circuits that utilize the windowing method.

SUMMARY

In summary, the VCO calibration method and apparatus of the present invention maintains a control voltage of voltage-controlled devices within a high tuning sensitivity range, and thus improves the performance of circuits using voltage-controlled devices. The present inventive method and apparatus features a voltage windowing method wherein a high tuning sensitivity window is a superset of a low tuning sensitivity window.

Several exemplary embodiments of the present invention have been described. In a first exemplary embodiment, the present invention maintains a control voltage within a predetermined tuning sensitivity range. In a second exemplary embodiment, the present inventive method and apparatus calibrates PLL devices that include multiple VCOs. In a third exemplary embodiment, the present invention calibrates control voltages and accounts for changes in operating temperature. The present invention is particularly useful in PLL circuits that include voltage-controlled oscillators.

A number of embodiments of the present invention have been described. Nevertheless, it will be understood that various modifications may be made without departing from the spirit and scope of the claimed invention.

Accordingly, it is to be understood that the invention is not to be limited by the specific illustrated embodiment, but only by the scope of the appended claims.

What is claimed is:

1. A method of calibrating a voltage-controlled device in a control loop, wherein the voltage-controlled device includes a frequency adjustable oscillator circuit, and wherein the frequency adjustable oscillator circuit includes a multiple capacitance level capacitor having a plurality of steady-state capacitance levels and a varactor, and wherein the frequency adjustable oscillator circuit inputs a control voltage, the method comprising the steps of:
   a) determining whether the control loop is in steady state;
   b) measuring the control voltage;
   c) determining whether the control voltage is within a first tuning voltage window;
   d) selecting a steady-state capacitance level that corresponds to control voltage operation of the frequency adjustable oscillator circuit within a second tuning voltage window if the control voltage is not within the first tuning voltage window, wherein the second window is a superset of the first window; and
   e) returning to the act (a).

2. The method as recited in claim 1, wherein the first tuning voltage window comprises tuning voltages corresponding to tuning sensitivities greater than 80 percent of the maximum tuning sensitivity.

3. The method as recited in claim 1, wherein the second tuning voltage window comprises tuning voltages corresponding to tuning sensitivities greater than 50 percent of the maximum tuning sensitivity.

4. The method as recited in claim 1, wherein the multiple capacitance level capacitor is a digital capacitor.

5. The method as recited in claim 4, wherein the selecting a steady-state capacitance level act (d) comprises controlling the digital capacitor, wherein the adjustable oscillator circuit operates at a control voltage within the second window.

6. The method as recited in claim 4, wherein the selecting a steady-mate capacitance level act (d) comprises incrementing or decrementing the digital capacitor, wherein the adjustable oscillator circuit operates at a control voltage within the second window.

7. The method as recited in claim 1, wherein the control loop is a phase locked loop (PLL) circuit.

8. The method as recited in claim 1, wherein the determining act (a) comprises determining whether an output frequency is within a predetermined range.

9. The method as recited in claim 1, wherein the determining act (a) comprises determining whether the control voltage is within a predetermined range.

10. The method as recited in claim 1, wherein the voltage-controlled device includes a plurality of voltage-controlled oscillators (VCO), and wherein each VCO of the plurality of VCOs operates over an overlapping frequency range.

11. The method as recited in claim 1, wherein the voltage-controlled device includes a plurality of voltage-controlled oscillators (VCO), and wherein each VCO of the plurality of VCOs operates over an adjacent frequency range.

12. The method as recited in claim 11, wherein prior to the determining act (a) the method comprises:
   i) determining whether the oscillator circuit is in an initialization phase;
   ii) creating a dead zone if the oscillator circuit is in an initialization phase;
   iii) selecting an initial output frequency outside of the dead zone and a corresponding initial control voltage;
   iv) setting initial VCO and capacitance settings in accordance with the initial control voltage.

13. The method as recited in claim 1, wherein the determining act (a) comprises the following sub-acts:
   i) calibrating for temperature conditions; and
   ii) determining whether the control loop is in steady state.

14. The method as recited in claim 13, wherein the calibrating for temperature conditions sub-act (i) comprises the following sub-acts:
   a) measuring a circuit temperature; and
   b) biasing the first tuning voltage window if the circuit temperature is within a nominal temperature range.

15. The method as recited in claim 14, wherein the biasing sub-act (b) of claim 14 comprises shifting the first window to operate at higher tuning frequencies if the circuit temperature is lower than the nominal temperature range, and shifting the first window to operate at lower tuning frequencies if the circuit temperature is higher than the nominal temperature range.

16. An apparatus for calibrating a voltage-controlled device in a control loop, wherein the voltage-controlled device includes a frequency adjustable oscillator circuit, and wherein the frequency adjustable oscillator circuit includes a multiple capacitance level capacitor having a plurality of steady-state capacitance levels and a varactor, and wherein the frequency adjustable oscillator circuit inputs a control voltage, comprising:
   a) means for determining whether the control loop is in steady state;
   b) means, responsive to the determining means, for measuring the control voltage; and
   c) means, responsive to the measuring means, for controlling the capacitor, wherein the controlling means provides a steady-state capacitance selecting level that corresponds to control voltage portion of the frequency adjustable oscillator circuit within a second tuning voltage window if the control voltage is not within a first tuning voltage window, wherein the second window is a superset of the first window.

17. The apparatus as recited in claim 16, wherein the first tuning voltage window comprises tuning voltages corresponding to tuning sensitivities greater than 80 percent of the maximum tuning sensitivity.

18. The apparatus as recited in claim 16, wherein the second tuning voltage window comprises tuning voltages corresponding to tuning sensitivities greater than 50 percent of the maximum tuning sensitivity.

19. The apparatus as recited in claim 16, wherein the determining means determines whether an output frequency is within a predetermined range.

20. The apparatus as recited in claim 16, wherein the determining means determines whether the control voltage is within a predetermined range.

21. The apparatus as recited in claim 16, wherein the voltage-controlled device includes a plurality of voltage-controlled oscillators (VCO), and wherein each VCO of the plurality of VCOs operates over an adjacent frequency range.

22. The apparatus as recited in claim 21, wherein when the oscillator circuit is in an initialization phase, the controlling means further operates to create a dead zone, select an initial output frequency outside of the dead zone and a corresponding initial control voltage, and set an initial VCO and capacitance settings in accordance with the initial control voltage.

23. The apparatus as recited in claim 16, wherein the first tuning voltage window is shifted to calibrate for temperature conditions.

24. The apparatus as recited in claim 23, wherein the the first tuning voltage window is shifted to operate at higher tuning frequencies if a circuit temperature is lower than a nominal temperature range, and the first tuning voltage window is shifted to operate at lower tuning frequencies if the circuit temperature is higher than the nominal temperature range.

25. A control loop apparatus, comprising:
   a) a frequency adjustable oscillator circuit, capable of outputting an output signal, comprising:
      i) a multiple capacitance level capacitor having a plurality of steady-state capacitance levels; and
      ii) a varactor, operatively connected to the multiple capacitance level capacitor;
   b) a control device, operatively connected to the frequency adjustable oscillator circuit, capable of receiving the output signal and inputting a control signal to the frequency adjustable oscillator circuit;
   c) a control loop steady state detection device, operatively connected to the frequency adjustable oscillator circuit, capable of determining whether the control loop is in steady state;
   d) a control voltage measurement device, operatively connected and responsive to the control loop steady state detection device, capable of measuring a control voltage;
   e) a windowing device, operatively connected to the control voltage measurement device, capable of determining whether the control voltage is within a first window; and
   f) a capacitance level selection device, responsive to the windowing device, operatively coupled to the multiple capacitance level capacitor, capable of selecting a steady-state capacitance level that corresponds to control voltage operation of the frequency adjustable oscillator circuit within a second window if the control voltage is not within the first window, wherein the second window is a superset of the first window.

26. The apparatus as recited in claim 25, wherein the control loop steady state detection device determines whether an output frequency is within a predetermined range.

27. The apparatus as recited in claim 25, wherein the control loop steady state detection device determines whether the control voltage is within a predetermined range.

28. The apparatus as recited in claim 25, wherein the voltage-controlled device includes a plurality of voltage-controlled oscillators (VCO), wherein each VCO of the plurality of VCOs operates over an adjacent frequency range.

29. The apparatus as recited in claim 25, wherein the control loop steady state detection device comprises:

i) a calibrating circuit capable of calibrating for temperature conditions; and ii) a determining device, operatively connected to the calibrating circuit, capable of determining whether the control loop is in steady state.

30. The apparatus as recited in claim 29, wherein the calibrating circuit comprises:

a) a measuring circuit capable of measuring a circuit temperature; and b) a biasing circuit, operatively connected to the measuring circuit, capable of biasing the first window if the circuit temperature is within a nominal temperature range.

31. The apparatus as recited in claim 30, wherein the biasing circuit is capable of shifting the first window to operate at higher tuning frequencies if the circuit temperature is lower than the nominal temperature range, and shifting the first window to operate at lower tuning frequencies if the circuit temperature is higher than the nominal temperature range.

* * * * *